United States Patent [19]

Hoke et al.

[11] Patent Number: 4,804,638
[45] Date of Patent: Feb. 14, 1989

[54] METALORGANIC CHEMICAL VAPOR DEPOSITION GROWTH OF GROUP II-IV SEMICONDUCTOR MATERIALS HAVING IMPROVED COMPOSITIONAL UNIFORMITY

[75] Inventors: William E. Hoke, Wayland; Lindley T. Specht, Waltham, both of Mass.

[73] Assignee: Raytheon Company, Lexington, Mass.

[21] Appl. No.: 175,637

[22] Filed: Mar. 28, 1988

Related U.S. Application Data

[63] Continuation of Ser. No. 943,238, Dec. 18, 1986, abandoned.

[51] Int. Cl.⁴ .......................................... H01L 21/20
[52] U.S. Cl. ...................... 437/81; 437/965; 148/DIG. 64; 148/DIG. 110; 427/419.8
[58] Field of Search ................... 437/965, 81; 148/DIG. 64, DIG. 110; 427/419.8

[56] References Cited

U.S. PATENT DOCUMENTS

| | | | |
|---|---|---|---|
| 3,725,135 | 4/1973 | Hager | 148/175 |
| 4,439,267 | 3/1984 | Jackson | 118/728 |
| 4,509,997 | 4/1985 | Cockayne | 148/175 |
| 4,524,090 | 6/1985 | Bottka | 427/87 |
| 4,533,410 | 8/1985 | Ogura | 148/175 |
| 4,566,918 | 1/1986 | Irvine | 427/87 |
| 4,568,397 | 2/1986 | Hoke | 148/DIG. 64 |
| 4,650,539 | 3/1987 | Irvine et al. | 427/87 |

OTHER PUBLICATIONS

Hoke et al., "Low-Temperature Metalorganic Growth of CdTe and HgTe Films Using Ditertiarybutyltelluride" Appl. Phys. Lett. 48(24), Jun. 1986, pp. 1669–1671.

D. C. Harris et al., "HgTe Films from Photolysis of (t-Butyl)HgTe(t-Butyl)", Materials Letters, vol. 4, No. 8, 9 (Aug. 1986), pp. 370–372.

Primary Examiner—Shrive Beck
Assistant Examiner—Vi Duong Dang
Attorney, Agent, or Firm—Denis G. Maloney; Richard M. Sharkansky

[57] ABSTRACT

A method for growing a Group II-IV epitaxial layer over a substrate is described. The method includes the steps of directing a plurality of vapor flows towards the substrate, including a Group II organic vapor, a Group VI organic vapor, and a Group II elemental mercury vapor. At least one of the Group II organic vapor and Group VI organic vapor has organic groups which sterically repulse the second one of the Group II and Group VI organic vapors or which provide electron transfer to the Group II atom or electron withdrawal from the Group VI atom. With the particular arrangements described, it is believed that substantially independent pyrolsis of the Group II organic vapor is provided over the growth region of the substrate, and accordingly, Group II depletions such as cadmium depletion in the epitaxial films provided over the substrate is substantially reduced.

59 Claims, 4 Drawing Sheets

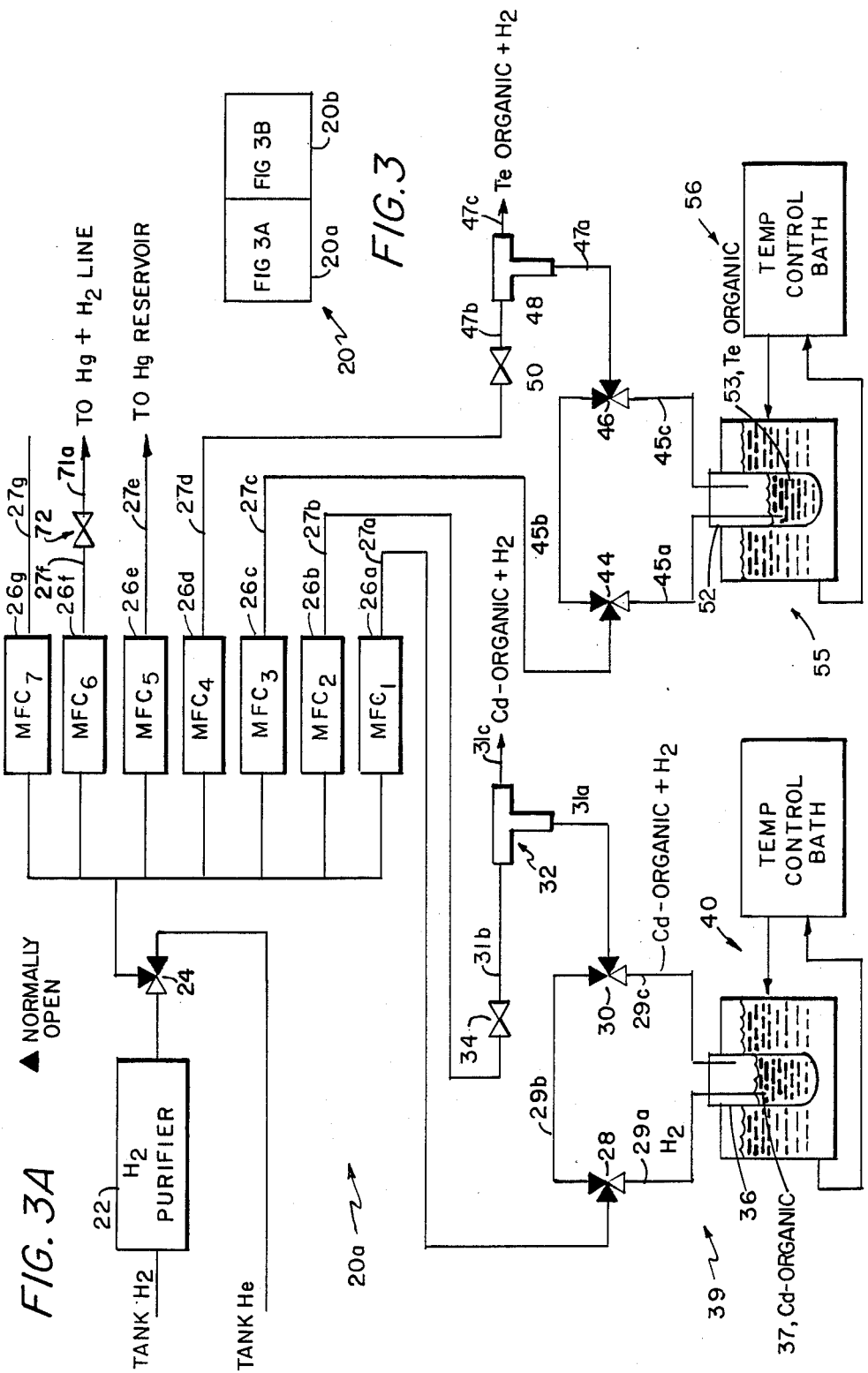

METALORGANIC CHEMICAL VAPOR DEPOSITION GROWTH OF GROUP II-IV SEMICONDUCTOR MATERIALS HAVING IMPROVED COMPOSITIONAL UNIFORMITY

This application is a continuation of application Ser. No. 943,238 filed Dec. 18, 1986 now abandoned.

BACKGROUND OF THE INVENTION

This invention relates generally to epitaxial growth techniques, and more particularly to growth of Group II-VI semiconductor crystalline materials.

As is known in the art, Group II-VI semiconductor epitaxial materials such as cadmium telluride and mercury cadmium telluride have important applications as photodetector elements for detection of electromagnetic energy in the special range from approximately 0.8 μm to 30 μm. By adjusting an alloy composition of cadmium and mercury, photodetector elements are provided which are sensitive to different wavelength ranges within the 0.8 μm to 30 μm wavelength band.

Several different techniques have been suggested for providing cadmium telluride and mercury cadmium telluride suitable for use in photodetector applications. One method suggested is metalorganic vapor phase expitaxy (MOVPE), also referred to metalorganic chemical vapor deposition (MOCVD). As it is known, the MOCVD technique for growing mercury cadmium telluride involves directing vapors of mercury, dimethylcadmium, and diethyltelluride into a reactor vessel and chemically reacting the directed vapors to provide the epitaxial material.

Several problems are encountered in the art of growing mercury cadmium telluride epitaxial layers by the MOCVD technique. One problem of particular importance is the compositional uniformity of the deposited epitaxial layers provided by the MOCVD technique.

Generally, the composition of these layers varies from the downstream portion of the substrate to the upstream portion. This compositional variation generally involves a progressively increasing depletion of Cd towards the downstream or back portion of the substrate whereas the upstream portion or front portion of the substrate is generally excessively rich in Cd. Variations in the lateral and side to side compositional uniformity Cd are generally also present.

The prevalent view regarding the chemical reaction mechanisms which occur in Group II-VI materials grown by MOCVD is set forth in an article entitled "Organometallic Growth of II-VI Compounds" by J. B. Mullin et al, Journal of Crystal Growth, Volume 55, 1981, pp. 92-106. In this article, the authors suggest that the directed alkyls of tellurium and cadmium may not pyrolyse independently. Rather, the authors suggest that adducts or complexes of these compounds are produced because DMCd (dimethylcadmium) and DETe (diethyltelluride) are attracted to one another in the vapor phase forming a weak bond. In the authors' view, the decomposition of these adducts leads to the formation of the Group II-VI materials and other products.

SUMMARY OF THE INVENTION

Ideal MOCVD Growth of HgCdTe, for example, may be viewed as an irreversible pyrolysis in which the primary alkyl (1° order) of the tellurium and the 0° order alkyl of the cadmium independently decompose into elemental tellurium and elemental cadmium. The elemental tellurium reacts with the elemental cadmium and elemental mercury provided in the vapor stream to form mercury telluride and cadmium telluride. The mercury telluride and cadmium telluride are then deposited over the substrate to form the mercury cadmium telluride as shown in Reactions 1-5 below:

$$DETe \rightarrow Te + H.C. \qquad \text{(Reaction 1)}$$

$$Te + Hg \rightarrow HgTe \qquad \text{(Reaction 2)}$$

$$DMCd \rightarrow Cd + H.C. \qquad \text{(Reaction 3)}$$

$$Cd + Te \rightarrow CdTe \qquad \text{(Reaction 4)}$$

$$HgTe + CdTe \rightarrow Hg_{1-x}Cd_xTe \qquad \text{(Reaction 5)}$$

where H.C. stands for hydrocarbons.

Although there is evidence that mercury telluride is grown by the independent pyrolysis of the primary alkyl of tellurium and the reaction between mercury and elemental tellurium (Reactions 1 and 2), cadmium telluride is now believed to be grown by a different process which occurs at elevated temperatures. The simplified overall reaction is as shown in Reaction 6.

$$DMCd + DETe \rightarrow CdTe + H.C. \qquad \text{(Reaction 6)}$$

In this reaction, the electropositive cadmium atom in dimethylcadmium (DMCd) is attracted to the electronegative tellurium atom in diethyltelluride. At low temperatures, this attraction is not significant enough to form a bond creating a stable adduct. However, at the elevated temperatures over the growth region in the reactor vessel, this attraction leads to a chemical reaction in which the alkyls of cadmium and tellurium react to form cadmium telluride plus other hydrocarbons. This chemical reaction leads to a rapid depletion of cadmium in the downstream portions of the HgCdTe layers formed over the substrate. Accordingly, the nonpyrolytic behavior of the cadmium alkyl is seen as a first cause of compositional nonuniformity in HgCdTe films formed by metalorganic chemical vapor deposition. In general, therefore, the nonpyrolytic behavior of the Group II alkyl, caused by attraction between the electropositive Group II atom and the electronegative Group VI atom, is seen as the first cause of compositional nonuniformity in MOCVD growth of Group II-VI materials.

A second cause of compositional nonuniformity in Group II-VI materials, particularity materials such as HgCdTe which involve two Group II elements, is believed to involve a reversible, exchange reaction in the vapor phase between the primary alkyl of the Group II atom and elemental Group II atom. In particular in HgCdTe, the primary alkyl of Cd and the elemental mercury are involved in the following reaction:

$$DMCd + Hg \rightarrow DMHg + Cd \qquad \text{(Reaction 7)}$$

Typically, with the MOCVD technique, the reactor walls and the mercury source are heated to a temperature of about 220° C. to prevent condensation of the mercury from the vapor stream. At these wall temperatures, Reaction 7 has an equilibrium constant in which the reaction is primarily driven towards the right, that is in a direction in which dimethylcadmium decomposes. At these temperatures, however, the rate of the reaction is relatively low, and accordingly the reaction is not a significant cause of Cd depletion. However, when the vapor stream arrives at the substrate, there is a sudden increase in temperature which causes the phase composition of the vapor stream to change since Reaction 7 is now driven very strongly to the right. Consequently, there is a strong variation in Cd concentration in which elemental cadmium is produced by the reaction. The elemental Cd is even more attracted to the diethyltelluride than DMCd. As shown in Reaction (8), it reacts with diethyltelluride to form cadmium telluride over the upstream portions of the susceptor. That is, CdTe may be deposited out of the vapor stream prior to reaching the substrate. This arrangement again leads to a cadmium depletion in downstream portions of the layers grown over the substrate.

Cd+DETe→CdTe+H.C. (Reaction 8)

Accordingly, the nonpyrolytic behavior of the cadmium alkyl is seen as a major cause of compositional nonuniformity in Group II-VI materials such as HgCdTe. This compositional nonuniformity is also believed present with other Group II-VI materials. For example, mercury zinc telluride has been proposed as a replacement material for mercury cadmium telluride. Zinc is a significantly more electropositive atom than cadmium. Accordingly, alkyl zinc compounds should be significantly more reactive towards electronegative species such as tellurium than alkyl cadmium compounds. As a consequence of this attraction, the first cause of compositional nonuniformity, i.e. the chemical reaction between the Group II alkyl and the Group VI alkyl, maybe even more significant for a material such as mercury zinc telluride. This mechanism is also believed present in mercury manganese telluride, a second potential replacement for mercury cadmium telluride. Manganese is also significantly more electropositive than cadmium, and consequently, a manganese alkyl would be significantly more reactive towards the Group VI alkyl than the cadmium alkyl. With mercury zinc telluride, since zinc is significantly more electropositive than Cd, there results a negligble exchange reaction with mercury, and accordingly, Reaction 9 occurs readily with substantial no reverse reaction present.

Zn+DMHg→DMZn+Hg (Reaction 9)

In accordance with the present invention, a Group II-VI layer is provided over a substrate. A first flow comprising a selected Group II organic is directed towards the substrate and a second flow comprising an organic of the Group VI element is also directed towards the substrate. At least one of the Group II and Group VI organic compounds have at least one organic group that sterically repulses the organic groups of the second one of the Group II and Group VI organic compounds. Preferably, the Group II organic has large, bulky organic groups which surround the Group II atom and sterically repulse the organic groups of the selected Group VI organic, thus reducing or substantially eliminating reactions between the Group II organic and the Group VI organic in the vapor stream. Preferably still, the selected Group II organic includes a branched organic groups which increases the steric replusion, of the Group VI organic compound. With this particular arrangement, by providing a Group II or Group VI organic source, having large organic groups surrounding the Group II element or Group VI element, steric hindrance is provided between the Group II organic, and the Group VI organic source. That is, by surrounding the Group II and/or Group VI element with large, bulky groups which sterically repulse one another, the Group II and/or Group VI atoms are prevented from getting close to each other, and thus the reactions involving the Group II organic, and the Group VI organic described above, are substantially reduced. The selected Group II and Group VI organic sources are thus substantially less reactive towards each other in the vapor stream when compared to conventional Group II organics and Group VI organic sources. Accordingly, the Group II organic and Group VI organic pyrolyse or decompose substantially independently of one another over the growth region above the substrate. Since the Group II and Group VI organics decompose substantially independently over the substrate, the concentration of Cd varies significantly less in the vapor stream, and hence the deposited layer has a substantially more uniform composition.

In accordance with a still further aspect of the present invention, the Group II organic sterically repulses the Group VI organic source which includes an organic group having a relatively low activation energy compared to the activation energy of a primary alkyl of the Group VI element for the formation of a free radical during pyrolysis of the Group VI organic compound. A flow comprising an elemental source of a Group II metal is also directed towards the substrate. The selected Group II organic having the large bulky organic groups is sterically hindered from reacting with the elemental Group II metal. Further, the sterically hindered Group II organic is selected to have a thermal stability comparably to the thermal stability of the selected Group VI organic. With this particular arrangement, low temperature growth of compositionally uniform Group II-VI materials is provided. The low growth temperatures should kinetically limit the rate of the exchange reaction involving the selected Group II organic and elemental Group II metal, and the steric replusion effects should further kinetically limit this exchange reaction. Thus, the second additional cause of compositional nonuniformity in MOCVD growth of Group II-VI materials is also substantially reduced, since the rate constant at low temperatures for the exchange reaction, is relatively small in the direction with provides the exchange of Group II metals. Side to side compositional uniformity is also believed improved, since with prior approaches, any cause of side to side nonuniformity, such as, variations in flow patterns and temperature gradients were amplified due to the uncontrolled and non-independent character of the chemical reactions which were occuring.

In accordance with a still further aspect of the present invention, a mercury cadmium telluride crystalline layer is grown over a crystalline substrate by directing a plurality of vapor flows towards the substrate. A first vapor flow comprises a source of mercury, a second vapor flow comprises an organic source of cadmium selected from the group consisting of diethylcadmium (DECd), di-N-propylcadmium (DPCd), di-isobutylcadmium (DIBCd), and di-neopentylcadmium (DnPCd). The tellurium organic includes at least one organic group selected from the group consisting of a secondary alkyl, a tertiary alkyl, an allyl, a benzyl, and a cycloallyl group bonded to the tellurium atom. The selected Cd organic, Te organic, and Hg are reacted at a temperature at which the exchange reaction involving the Cd organic and Hg is kinetically limited. With this arrangement, by providing a cadmium organic having organic groups surrounding the cadmium atom which sterically hinder the tellurium atom from reacting with the cadmium atom, a substantially reactive-free transport of these vapors through the reactor tube towards the elevated temperature region over the substrate is provided. Further, since the temperature over the growth region is such that the exchange reaction is kinetically limited (i.e. the rate of the reaction is low) substantially more uniform growth of HgCdTe is provided since there is less elemental Cd available to react with the Te organic prior to the substrate. At the growth temperatures over the substrate, the cadmium organic and tellurium-organic pyrolyse substantially independently, providing free tellurium and cadmium. The free tellurium reacts with the elemental mercury and free cadmium to form mercury cadmium telluride. Since cadmium is not lost in the vapor stream prior to pyrolysis of the cadmium organic over the substrate, the front to back compositional uniformity of the deposited layers will be substantially more uniform. Due to the controlled reactions which are occuring, i.e. substantially independent pyrolysis of the cadmium and tellurium alkyls, improvement is also anticipated in the side to side compositional uniformity.

In accordance with a further aspect of the present invention, a Group II-VI layer is provided over a substrate. A first flow comprising a selected Group II organic is directed towards the substrate and a second flow comprising an organic of the Group VI element is also directed towards the substrate. At least one of the Group II and Group VI organic compounds have organic groups which provide either electron transfer to the electropositive Group II element or electron transfer from the electronegative Group VI element. Preferably, the Group II organic has an electron releasing organic group bonded directly to the Group II element. The electron releasing group should preferably be a stable group where the potential for incorporation of unintended dopants could be a problem. An example of an electron releasing group is the phenyl group ($C_6H_5$). With this particular arrangement, by providing an organic Group II source having electron releasing groups bonded to the Group II element, the electropositivity of the Group II atom is reduced by the transfer of electronic charge from the selected electron releasing group. In particular, since the electropositivity of the Group II element is reduced by the presence of the phenyl groups, this will concomitantly reduce the attractive force between Group II atoms and Group VI atoms while the Group II organic and the Group VI organic are in the vapor stream. The electronegative nature of the phenyl group should also reduce the interaction between an organic Group VI compound and the organic Group II compound having the phenyl group attached.

In accordance with a still further aspect of the present invention, the Group II compound is selected having an organic group bonded directly to the Group II atom which provides electron transfer to the electropositive Group II atom and provides steric hinderance between the Group II atom and Group VI atom in the Group VI organic source. Preferably, the Group II element has a pair of phenyl groups bonded directly to it with at least one hydrogen atom of one of the phenyl groups replaced by an organic group. Preferably, electrophilic substitution at a hydrogen position on the phenyl group is from a species belonging to the class of groups which are generally classified as activating, ortho, para directors. Examples of organics classified as weakly activating groups include phenyls and alkyls (methyl, ethyl etc.). Hetrogroups that is groups containing atoms other than hydrogen and carbon and classified as moderately and strongly activating groups include alkoxides, $-OCH_3$, $-OC_2H_5$ etc.; $-NHCOCH_3$; $-OH$ and $-NH_2$ ($-NHR$, $NR$) where R is a radical, may also be used, keeping in mind the potential for introduction of oxygen and nitrogen. For example, a methyl group may be used to replace a hydrogen at one of the ortho positions or the para position of each one of the phenyl groups. The presence of the large organic groups will sterically hinder the Group II atom from reacting with the Group VI atom by the presence of out-of-plane hydrogen atoms associated with the methyl group. That is, these hydrogen atoms will partially shield the Group II atom. Furthermore, with this shielding of the Group II atom by the out-of-plane hydrogen atoms the vapor pressure of the Group II organic will also increase, since the intermolecular attraction between a cadmium atom of one molecule and a phenyl group of a similar molecule is reduced. Further, the use of the activating ortho and para directors will increase the electron transfer and, hence, further reduce the electropositivity of the Group II atom.

In accordance with a further aspect of the present invention, the hydrogens at both ortho positions of each phenyl group are replaced by a large organic group such as a phenyl group, or an alkyl group such as a methyl, ethyl etc. Substitution of a methyl group, for example, in each ortho position of each phenyl group will sterically repulse the methyl groups of the other phenyl groups and, accordingly, the methyl groups will be rotated 90° from each other resulting in a nonplanar molecule. With this particular arrangement, in addition to the steric hinderance provided by the presence of the substituted groups, and the electron releasing of the phenyl groups, an additional feature of a molecule having both ortho positions of each phenyl group substituted is that the central Group II atom is enclosed by a cage formed by the rotated methyl groups. This structure results in a molecule which, although heavier, is believed to have a higher vapor pressure than, a nonsubstituted Group II phenyl, or the single ortho position substituted Group II phenyl, since the cage of methyl groups around the Group II atom should significantly reduce intermolecular attractions between the Group II atom of one molecule and a phenyl group of a second molecule. Moreover, the cage of methyl groups surrounding the Group II atom should make this atom particularly unreactive towards Group VI alkyls.

In accordance with a still further aspect of the present invention, a mercury cadmium telluride crystalline layer is grown over a substrate by directing a plurality of vapor flows towards the substrate. The first vapor flow comprises a source of mercury, the second vapor flow comprises an organic source of cadmium selected from the group consisting of di-phenylcadmium (DPCd), di-orthotolylcadmium (DOTCd), di-(2,6 xylyl)cadmium (DXCd), and di-mesitylcadmium (DMSCd). The Group VI organic includes organic groups selected from the group consisting of a primary alkyl, a secondary alkyl, a tertiary alkyl, an allyl, a benzyl, and a cycloallyl group bonded to the Group VI element. With this particular arrangement, by providing a cadmium organic having organic groups which sterically hinder reactions with the tellurium organic, and provides for electron transfer to the electropositive cadmium atom, the attraction between the cadmium organic and the tellurium organic is concomitantly reduced. The steric hinderance will also reduce the exchange reaction between the cadmium organic and mercury. Accordingly, substantially independent pyrolysis of each organic source over the substrate is provided, thereby, providing a mercury cadmium telluride layer having improved compositional uniformity.

BRIEF DESCRIPTION OF THE DRAWINGS

The foregoing features of this invention, as well as the invention itself, may be more fully understood from the detailed description of the drawings, in which:

FIG. 3 is a view showing the relationship between FIGS. 3A and 3B;

FIGS. 3A, 3B are schematic diagrams of a growth apparatus for use in growing the epitaxial layer shown in FIG. 1.

DESCRIPTION OF THE PREFERRED EMBODIMENTS

Figure 1:
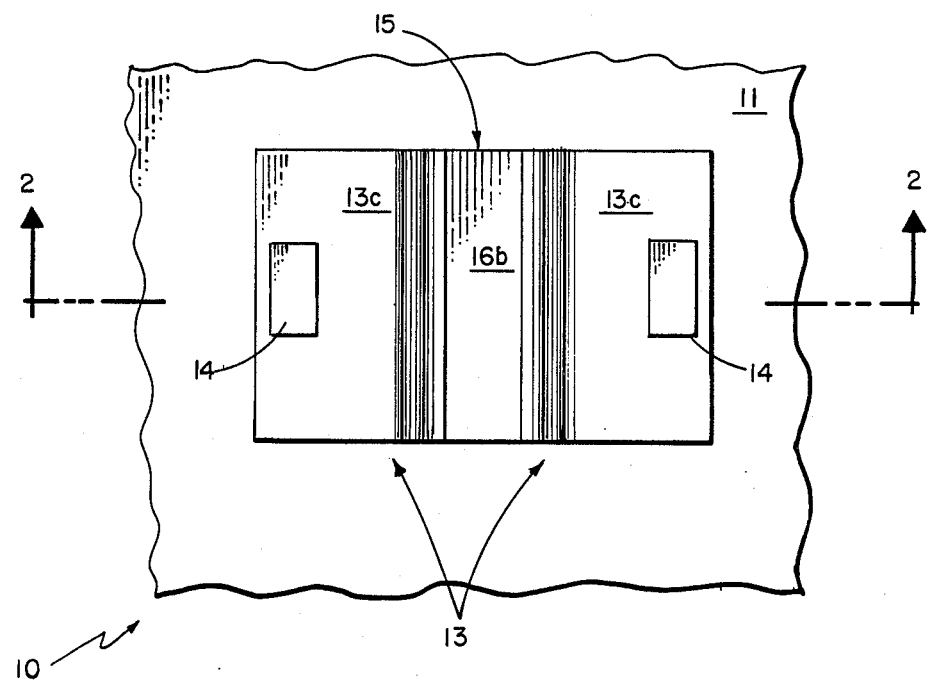
FIG. 1 is a plan view of a photodetector element, here a photoconductive element including crystal layers comprising Group II-VI semiconductor materials.
Figure 2:
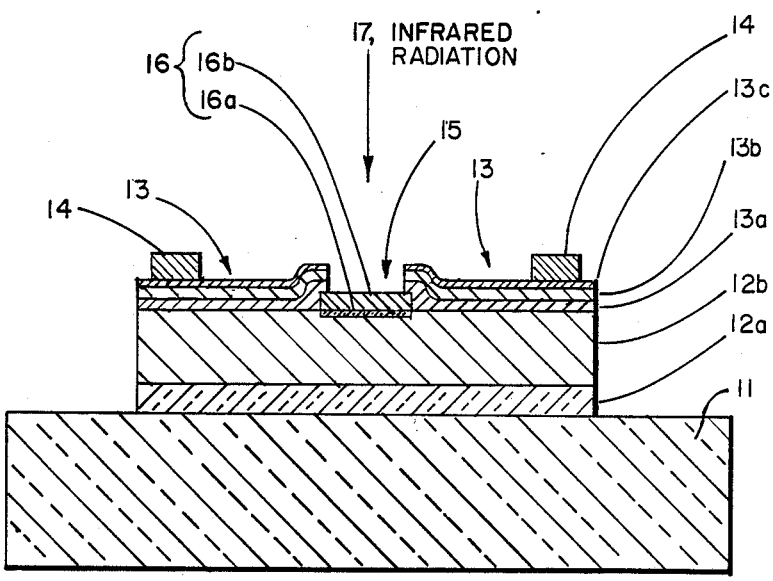
FIG. 2 is a cross-sectional view taken along line 2—2 of FIG. 1.

Referring now to FIGS. 1 and 2, a typical photoconductive element 10, suitable for use in a photoconductive array (not shown) is shown to include a substrate 11, here comprising cadmium telluride (CdTe) or gallium arsenide (GaAs), indium antimonide (InSb) or other suitable Group II-VI or Group III-V substrate materials or sapphire ($Al_2O_3$). Disposed over and here on a substrate 11 is a Group II-VI epitaxial buffer layer 12a here comprising cadmium telluride (CdTe), and a second epitaxial layer 12b of cadmium telluride (CdTe) or mercury cadmium telluride (HgCdTe), or other suitable Group II-VI material such as HgZnTe, or a material such as HgMnTe. Disposed on portions of the epitaxial layer 12b are a pair of electrical ohmic-type contacts 13 each provided from a patterned composite layer comprising sequentially deposited layers 13a, 13b, and 13c respectively, of indium (In) 10,000 A thick, chromium (Cr) 500 A, and gold (Au) 5,000 A thick. Pads 14 comprising gold each 1.5 m thick are disposed over the contacts 13 to provide a bonding point for external components.

Disposed in a channel region 15 between the ohmic contacts 13 is a passivation layer 16a, here of an in situ anodic oxide formed from a portion of the HgCdTe layer 12b as is known, 800 A thick and an anti-reflection coating layer 16b. Layer 16a, 16b are used to protect the channel region 15 and to provide a composite layer window 16 which is transparent to incident electromagnetic energy 17 generally in the wavelength range of approximately 0.8 $\mu$m to 30 $\mu$m which is directed towards the window 16. In response to such incidence radiation 17, the conductivity of the epitaxial layer 12b changes, thus permitting the photoconductive element to detect the presence of the incident electromagnetic radiation 17. Further, the ratio x of Cd to Te may be adjusted, as is known, to selectively cover different ranges of wavelengths within the band of approximately 0.8 $\mu$m to 30 $\mu$m.

Figure 3B:
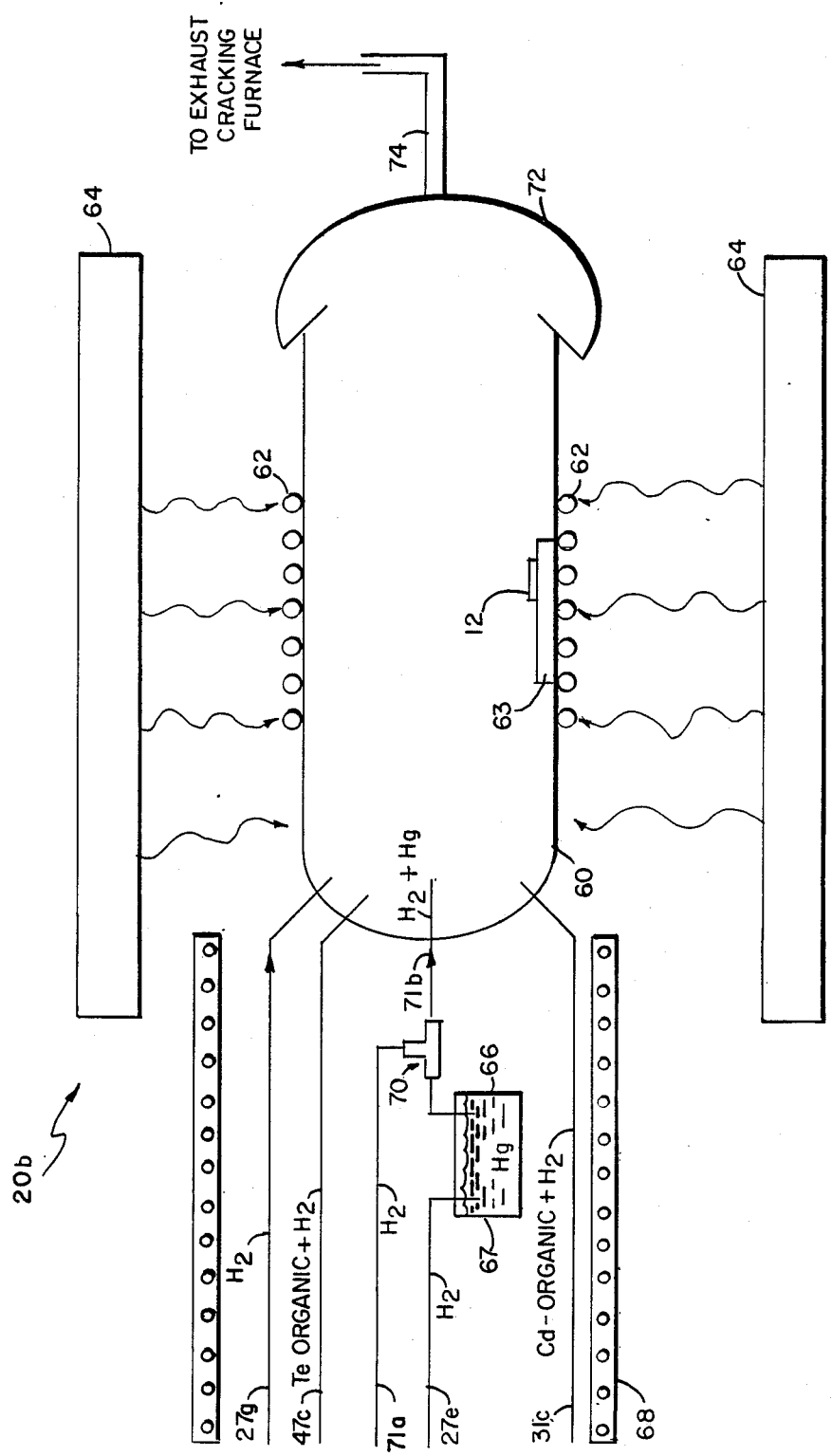

Referring now to FIGS. 3, 3A, and 3B, a schematic representation of a vapor phase epitaxial apparatus 20 (FIG. 3) used for growing epitaxial layers 12a, 12b of cadmium telluride or mercury cadmium telluride, as described in conjunction with FIGS. 1 and 2 above, includes a vapor apparatus 20a (FIG. 3A) having a manifold 26 with mass flow controllers 26a–26g, and bubbler apparatus 39 and 55, as shown. During operation, hydrogen is fed, via $H_2$ purifier 22 and valve 24, to manifold 26, whereas, helium is fed through apparatus 20 when the apparatus 20 is inoperative and exposed to air. The vapor phase apparatus 20 also includes a vapor phase epitaxial reactor 20b (FIG. 3B), here including an open quartz reaction tube 60, as shown. Suffice it here to say that a graphite susceptor 63 is disposed in the quartz reaction tube 60 and the susceptor is inductively heated by an r.f. coil 62. R.f. coil 62 is disposed around the periphery of quartz reactor tube 60 and is activated to raise the temperature of the susceptor 63, the substrate 11 disposed on the susceptor 63, and the immediate region 61 around the substrate 11 to a predetermined temperature. The temperature of the substrate 11 is monitored, via a thermocouple (not shown), embedded in the susceptor 63. Prior to the susceptor 63 and the substrate 11 being heated, however, the system is purged of atmospheric gasses by introducing helium, then hydrogen into the interior of the furnace tube 60 and vapor apparatus 20a. Then vapors from lines 27e-27g, 31c and 47c are fed into the tube where they decompose and react to provide the epitaxial layers 12a, 12b. Quartz reaction tube 60 also includes a cap 72 at an opposite end from lines 27e, 27g, 31c and 47 which is coupled to a quartz exhaust line 74 used to exhaust gasses from tube 60.

Referring now particularly to FIG. 3A, the vapor apparatus 20a provides tubes 31c, 47c and 27e-27g which feed vapors to the quartz reaction tube 60 (FIG. 3B), as shown.

Tube 31c the Group II organic source $+H_2$ tube is fed from a junction member 32. Junction member 32 is used to mix flows from two gas sources delivered to a pair of ports thereof, and direct said mixed gas flow to third port thereof, which is coupled to the quartz tube 31c. The first port of junction 32 is fed from the bubbler apparatus 39. Bubbler apparatus 39 includes a pair of solenoid control valves 28, 30. A first one of the solenoid control valves, 28, 30, here solenoid control valve 28, has a first port coupled to a first mass flow controller 26a, via tubes 27a and has a second port coupled to a bubbler 36, via tube 29a. Bubbler 36 here has disposed therein the selected Group II organic compound, as will be described hereinafter. The bubbler 36 is provided in recirculating temperature control bath 40 which provides a constant flow of a liquid around the bubbler to maintain the organic Group II compound 36 at a predetermined temperature to provide a sufficient vapor pressure. This range of temperature may extend but not necessarily be limited to the range of −20° C. to 100° C. A second tube 29c is disposed into bubbler 36, above surface of the organic Group II source and is coupled to a port of solenoid control valve 30. A third tube 29b is coupled between the remaining ports of solenoid control valves 28 and 30.

The normally deactivated state of solenoid control valves 28 and 30 enables hydrogen gas to pass from the hydrogen source, here the mass flow controller 26a, via tube 27a, to tube 29b and on through to tube 31c to purge the reactor vessel of atmosphere gasses, as described above.

During epitaxial growth of cadmium telluride or mercury cadmium telluride, for example, solenoid control valves 28 and 30 are placed in their activated state enabling hydrogen gas to pass through tube 29a into bubbler 36 which contains a selected organic cadmium source 37. The hydrogen gas bubbles through the organic cadmium source 37 and picks up molecules of the organic cadmium source 37. Therefore, a mixture of the organic cadmium source and hydrogen (Cd-organic $+H_2$) emerges from bubbler 36, via line 29c, and is routed by solenoid control valve 30 to line 31a. A second mass flow controller 26b is activated to provide a predetermined flow of a carrier gas, here hydrogen, through a valve 34, via line 31b, to junction member 32. Therefore, emerging from line 31c is a diluted vapor flow of the Cd organic with respect to the carrier gas, here hydrogen.

Tube 47c, the "Group VI-organic tube," is fed from a junction member 48. Junction member 48 is used to mix flows from two gas sources and delivers said mixed gas flow to a third port coupled to tube 47c. The first port of junction member 48 is fed from the bubbler apparatus 55. Bubbler apparatus 55 includes a pair of solenoid control valves 44, 46. A first one of said solenoid control valves, here solenoid control valve 44, has a first port coupled to a third mass flow controller 26c, via tube 27c, and has a second port coupled to a bubbler 52, via tube 45a. Bubbler 52 here has disposed therein a Group VI organic 53 as will be described hereinafter. Suffice it to say here that the Group VI organic, may be a primary alkyl of the Group VI element or alternatively is selected to have an activation energy for the formation of a free radical during dissociation of the Group VI-organic that is lower than the activation energy during disassociation of a primary alkyl of the Group VI element. The bubbler 52 is provided in a recirculating temperature control bath 56 which provides a constant flow of a liquid around the bubbler 52 to maintain the tellurium organic 53 in bubbler 52 at a predetermined temperature sufficient to provide adequate vapor pressure. This range may extend to but is not necessarily limited to the range of $-20°$ C. to $+100°$ C. A second tube 45c is disposed into bubbler 52, above the surface of the Group VI organic, and is coupled to a port of solenoid control valve 46. A third tube 45b is coupled between remaining ports of solenoid control valves 44 and 46.

The normally deactivated state of solenoid control valves 44 and 46 enables hydrogen gas to pass from the hydrogen source, here the mass flow controller 26c, via tube 27c, to tube 45b, and on through tube 47c to purge the reactor vessel of atmospheric gasses, as described above. During epitaxial growth of cadmium telluride or mercury cadmium telluride over substrate 11, valves 44 and 46 are placed in their activated state, enabling hydrogen gas to pass through tube 45a into bubbler 52 which contains the Group VI organic 53. The hydrogen gas bubbles through the Group VI organic 53 and picks up molecules of the Group VI organic 53. Therefore, a mixture of the Group VI organic and hydrogen (Group VI-organic $+H_2$) emerges from the Group VI organic 53, via line 45c, and is routed by solenoid control valve 46 to line 47a. A fourth mass flow controller 26d is activated to provide a predetermined flow of a carrier gas, here hydrogen, through a valve 50 and via line 47b to junction member 48. Therefore, emerging from line 47c is a diluted vapor flow of the Group VI organic with respect to the concentration of the carrier gas, here hydrogen.

Tube 27e is fed from a fifth mass flow controller 26e to a quartz reservoir 66 (FIG. 3B) containing a liquid source of a Group II element such as mercury. Hydrogen gas is directed over the surface of the liquid mercury, and vapor molecules of mercury over the liquid mercury surface are picked up by the hydrogen gas flow, providing a vapor flow of mercury and hydrogen ($Hg+H_2$). The vapor flow is fed to a quartz junction element 70 (FIG. 3B). A second input port of quartz junction element 70 is fed via a quartz tube 71a which is coupled to a sixth mass flow controller 26f, via a valve 72 and tube 27f. Emerging from junction element 70 via tube 71b and into tube 60 is, therefore, a diluted flow of mercury vapor and hydrogen.

Referring particularly now to FIG. 3B, as previously mentioned, the susceptor 63 is heated by an r.f. coil disposed around the quartz reaction tube 60.

A quartz reservoir 66 containing the liquid elemental mercury and the region adjacent thereof is resistively heated by a resistance heat source 68, as shown, to a temperature of at least 100° C., but generally less than 250° C. preferable within the range of 150° C. to 180° C. The zone immediately after the reservoir 66 and past the substrate 11 is then heated by banks of infrared lamps 64 to a temperature in the range of 100° C. to 250° C. with 150° C. to 180° C. being the preferred range. Heating of the walls prevents premature condensation of mercury from the vapor stream.

The outwardly exposed surface of the substrate 11 is degreased and cleaned using appropriate solvents and then polished using an appropriate material which will etch the material of the substrate. For example, a bromine methanol solution is used to chemically polish CdTe or GaAs before growth of the various epitaxial layers. The substrate 11 is then placed on the susceptor 63 which is then disposed in the quartz reaction tube 60.

In operation, furnace tube 60 is purged of atmospheric gasses by introduction of helium and then hydrogen gas as described above. The susceptor 63 is then inductively heated by the r.f. coil 62, the reservoir 66 by the resistive heating element 68, and reaction tube 60 by the infrared lamps 64. Each is then allowed to reach the growth temperatures. When the apparatus 20b has reached the growth temperatures, valves 28, 30, 34, 44, 46, 50, and 72 are activated enabling diluted mixtures of hydrogen gas + Group II organic, hydrogen gas + the Group VI organic, and hydrogen gas + mercury to emerge from tubes 31c and 47c and 71b, respectively, upstream from the substrate 11.

The hydrogen, mercury, and organic vapors are at the desired operating temperature provided by the uniform heating of the substrate 11 and the region 61 around the substrate 11. It is believed that the directed, selected organic source will pyrolyse substantially independent of one another and produce mercury cadmium telluride in accordance with chemical Reactions 1A-5A below:

Te organic→Te+H.C.     (Reaction 1A)

Te+Hg→HgTe     (Reaction 2A)

Cd organic→Cd+H.C.     (Reaction 3A)

Cd+Te→CdTe  (Reaction 4A)
HgTe+CdTe→Hg$_{1-x}$Cd$_x$Td  (Reaction 5A)

where H.C. stands for hydrocarbons.

The composition x is controlled by regulating the flow of H$_2$ into the Hg reservoir, the temperature of the Hg reservoir and the concentration of cadmium organic and the tellurium organic.

The mole fraction (i.e., concentration of Cd-organic, Te organic and Hg) is given by:

$$MF(\text{Cd organic}) = \frac{\text{H}_2 \text{ thru bubbler 36}}{\text{Total H}_2 \text{ Flow in Tube 60}} \times \frac{\text{Cd organic Vapor Pressure (Torr)}}{760 \text{ (Torr)}}$$

$$MF(\text{Te organic}) = \frac{\text{H}_2 \text{ thru bubbler 52}}{\text{Total H}_2 \text{ Flow in Tube 60}} \times \frac{\text{Te organic Vapor Pressure (Torr)}}{760 \text{ (Torr)}}$$

$$MF(\text{H}_g) = \frac{\text{H}_2 \text{ over reservoir 66}}{\text{Total H}_2 \text{ Flow in Tube 60}} \times \frac{\text{H}_g \text{ Vapor Pressure (Torr)}}{760 \text{ (Torr)}}$$

Only a portion of the organic vapors which are directed over the substrate 11 is actually reacted. Unreacted organic vapors are exhausted from the reactor tube 60, via the exhaust line 74, and are directed towards an exhaust cracking furnace (not shown) which cracks the remaining organic gasses into the elements and provide a gas stream which comprises substantially hydrogen and various hydrocarbons.

In accordance with one aspect of the invention, the cadmium source is an organic source having organic groups which are selected to sterically hinder the cadmium atom from reacting with a tellurium atom provided in the organic tellurium source. Preferably, the selected organic group is not bonded directly to the cadmium atom since bonding of the organic group directly to the cadmium atom will increase the reactivity of the cadmium organic.

The selected Cd organic has a general chemical structure as:

R$_1$—Cd—R$_2$ where R$_1$, R$_2$ may or may not be the same, and at least one of R$_1$, R$_2$ has the general chemical structure as set forth below:

$$Y-\underset{X_2}{\overset{X_1}{\underset{|}{\overset{|}{C}}}}-$$

where X$_1$, X$_2$ may or may not be the same and preferably are selected from the group of hydrogen, a halogen, or an organic. Y has the general chemical structure as set forth below:

$$Y_2-\underset{Y_3}{\overset{Y_1}{\underset{|}{\overset{|}{C}}}}-$$

where Y$_1$, Y$_2$, Y$_3$ may or may not be the same and are preferably hydrogen, a halogen, or an organic.

As shown below, the Cd organic has an organic group which incorporates the carbon atom at the β position of the chain of the Cd organic.

$$Y_2-\underset{\underset{\beta}{Y_3\ X_2}}{\overset{Y_1\ X_1}{\underset{|\ |}{\overset{|\ |}{C-C}}}}-Cd-\underset{\underset{\beta}{X_2\ Y_3}}{\overset{X_1\ Y_1}{\underset{|\ |}{\overset{|\ |}{C-C}}}}-Y_2$$

With this particular arrangement, the large bulky groups at the ends of the chain will sterically hinder the cadmium atom from reacting with the tellurium atom in the tellurium organic.

One preferred example of a Group II organo having a large bulky group at the β position carbon in the organic group, thereof, is the chemical di-neopentyl-cadmium ((CH$_3$)$_3$CCH$_2$)$_2$Cd. Di-neopentylcadmium has a general chemical structure as set forth below:

$$CH_3-\underset{\underset{}{CH_3}}{\overset{CH_3}{\underset{|}{\overset{|}{C}}}}-\underset{\underset{}{H}}{\overset{H}{\underset{|}{\overset{|}{C}}}}-Cd-\underset{\underset{}{H}}{\overset{H}{\underset{|}{\overset{|}{C}}}}-\underset{\underset{}{CH_3}}{\overset{CH_3}{\underset{|}{\overset{|}{C}}}}-CH_3$$

The molecule contains two tertiary butyl groups which are separated from the cadmium atom by a α position carbon atom, here a CH$_2$ group. Since the tertiary butyl groups are not bonded directly to the cadmium atom, they do not significantly destabilize the di-neopentylcadmium molecule. Accordingly, di-neopentylcadmium (DNPCd) should have a thermal stability comparable to diethylcadmium (DECd). DNPCd has several advantages. DNPCd is believed to reduce reactions between itself and the selected tellurium organic due to steric replusion provided by the tertiary butyl groups in the DNPCd molecule. The presence of these tertiary butyl groups makes it difficult for the two molecules and, in particular, for the two atoms of the two molecules to come within a close enough distance to react. Furthermore, by selecting an appropriate tellurium source, low temperature growth of mercury cadmium telluride will be provided. Accordingly, Reaction 7, the exchange reaction between the Group II organic and mercury should be kinetically limited and, therefore, not be a major cause of cadmium depletion. The neopentyl groups ((CH$_3$)$_3$CCH$_2$) due to their weight and size should also reduce the rate of free radical chain reactions and, therefore, provide a molecule which is substantially less reactive in the vapor stream than dimethylcadmium.

A second preferred example is the chemical diisobutylcadmium ((CH$_3$)$_2$CHCH$_2$)$_2$Cd which has an isopropyl groups separated from the Cd atom by a α position carbon atom, here a CH$_2$ group. Di-isobutylcadmium has a general chemical structure as set forth below:

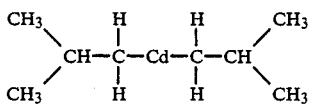

Other examples include di-N-propylcadmium and diethylcadmium, each has the respective general chemical structure set forth below:

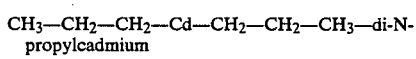

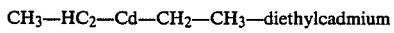

Alternatively, the cadmium organic may have organic groups bonded directly to the cadmium atom which transfers electron charge to the electropositive cadmium atom. By reducing the electropositively of the cadmium atom with the electron releasing organic group, the cadmium organic will be less reactive towards the organic tellurium molecule than prior known dimethylcadmium. An example of such a compound is diphenylcadmium having the general chemical formula set forth below:

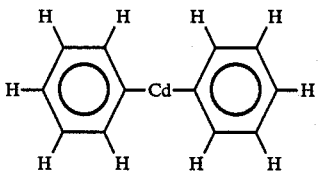

As shown, diphenylcadmium contains two phenyl groups which are sources of electrons because of their π level electron clouds. The central cadmium atom is electropositive. Consequently, the electropositivity of the cadmium atom should be reduced by the presence of the phenyl groups. This will concomitantly reduce the attractive force between the cadmium organic and tellurium organic. The negative charge nature of the phenyl groups should further reduce the interaction between a selected tellurium organic and diphenylcadmium, since the phenyl groups should repel the electronegative tellurium atom. Another feature of using an aromatic cadmium compound such as diphenylcadmium is that typically aromatic cadmium compounds are relatively stable. Accordingly, it can be stored for long periods of time without decomposition. Furthermore, the phenyl groups themselves are also stable entities, and it is believed that the rings will not be broken during pyrolysis. Accordingly, it is also believed that MOCVD growth using diphenylcadmium should result in little carbon incorporation into the mercury cadmium telluride films. Although diphenylcadmium has a relatively low vapor pressure and is a solid having a melting point of 174° C., it is nevertheless believed that such a source may be used.

Figure 4:
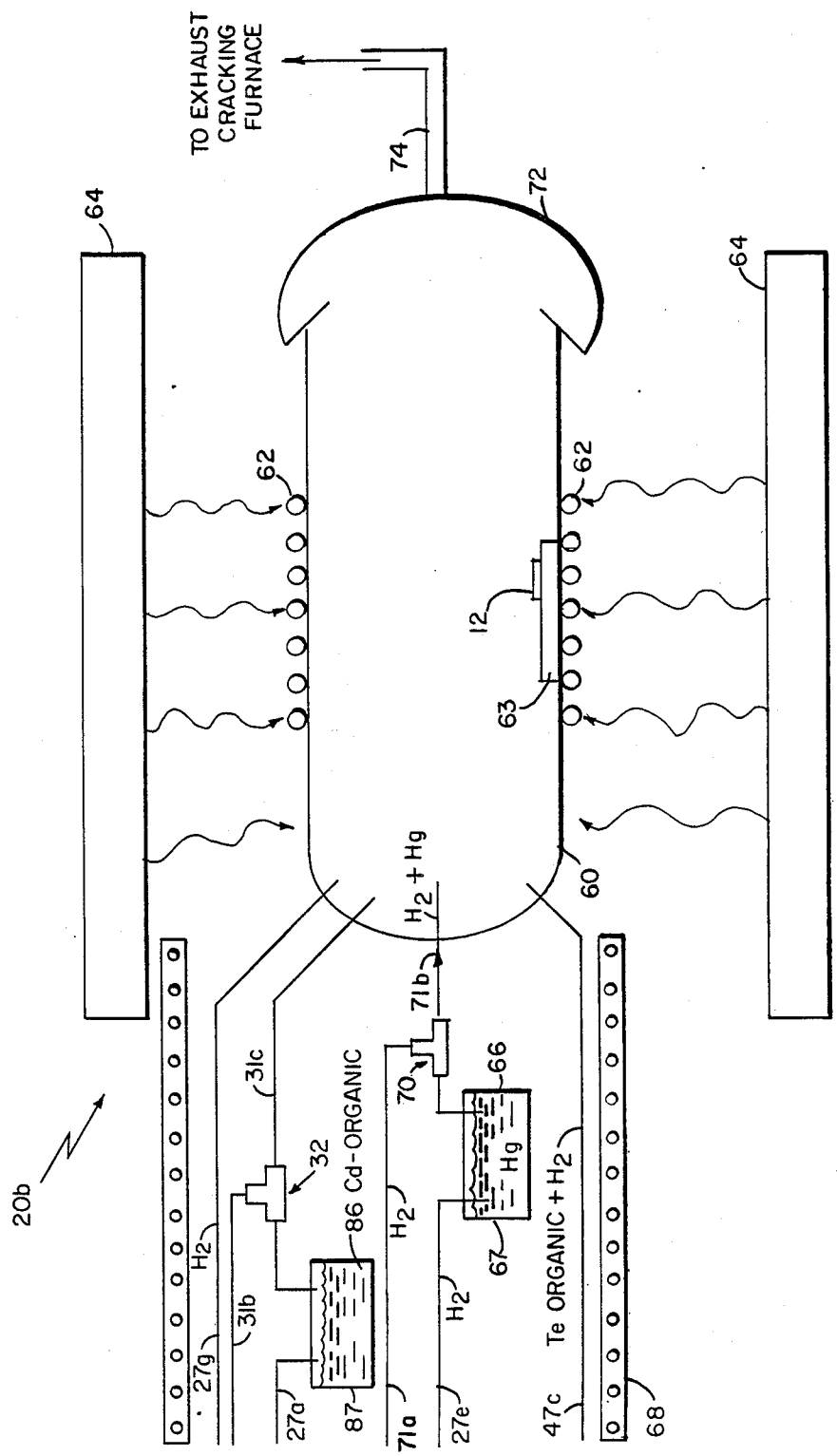
FIG. 4 is a schematic diagram of an alternate reactor vessel having a reservoir for those Group II organic sources having a high melting temperature.

A heated reservoir arrangement such as shown in FIG. 4 may be used to provide a suitable vapor flow of diphenylcadmium, in a similar manner as reservoir 66 provides the Hg vapor flow. That is the line 27a may be directed to a reservoir 87 containing the Cd organic 86. Hydrogen gas is passed over the reservoir and picks up molecules of the Cd organic 86 and directs this vapor stream into the reactor vessel via tube 31c after predetermined dilution with H₂ as described above. The reservoir is disposed within a heated furnace at a predetermined temperature, as shown. The furnace may be a multizone furnace to heat the Cd organic reservoir and Hg reservoir to selected temperatures.

Alternative cadmium sources having electron releasing phenyl groups rings include di-orthotolylcadmium having the general chemical structure set forth below:

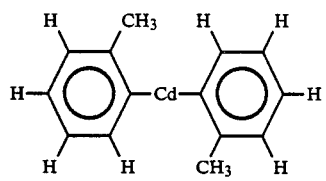

Di-orthotolylcadmium is similar to diphenylcadmium except that one ortho position hydrogen on each benzene ring is replaced by a methyl group. The methyl groups also increase the transfer of electron charge from the phenyl groups to the cadmium atoms, consequently, reducing the positive charge of the Cd atom. Although this molecule is heavier than diphenylcadmium, it is believed nevertheless, di-orthotolylcadmium (DOTDc) will have a higher vapor pressure, because by attaching the methyl group at one of the ortho positions, the planar symmetry of the molecule is altered by the out-of-plane methyl hydrogens. These hydrogens atoms partially shield the central cadmium atom, and as a consequence reduce the intermolecular attraction between a cadmium atom of one molecule with a benzene ring of another molecule. Di-orthotolylcadmium has a melting point of 115° C. which may indicate that DOTCd will have a higher vapor pressure than DPCd. Furthermore, it is believed that the partial shielding of the cadmium atom by the out-of-plane hydrogen atoms will result in reduced attraction between the cadmium atom and a tellurium atom in the tellurium organic.

Further alternate examples of cadmium compounds having increased electron transfer and increased steric hinderance are di-(2,6 xylyl) cadmium (DXCd) and di-mesitylcadmium (DMSCd). These molecules have the general chemical structure as set forth below:

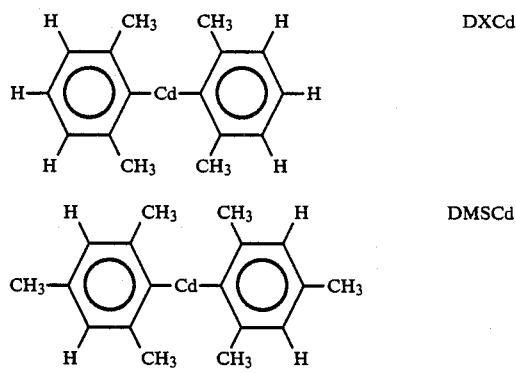

These compounds are the same as di-orthotolycadmium except that DXCd has methyl groups at both ortho positions on each benzene ring and DMSCd has methyl groups at both ortho positions and the para position of each benzene ring. With two ortho groups attached to each benzene ring, the electron charge transferred to the cadmium atom is further increased. Further, the ortho methyl groups attached to the benzene ring should sterically repulse each other resulting in a nonplanar molecule. A further important feature of this structure is that because of the steric hinderance, the cadmium atom will be enclosed by a cage of four methyl groups. This increased steric hinderance should concominantly increase the vapor pressure of DXCd. Furthermore, the cage of methyl groups around the cadmium atom should reduce the attraction between the tellurium organic and DXCd or DMSCd and should prevent or substantially limit the exchange reaction between cadmium and mercury.

Accordingly, the selected Cd organic having electron releasing groups has the general chemical structure as set forth below:

where $R_3$, $R_4$ may or may not be the same and at least one of $R_1$, $R_2$ has the general chemical structure as set forth below:

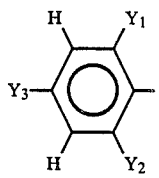

where hydrogen (H) is generally, but not necessarily, provided at the meta positions and where $Y_1$, $Y_2$ are at the ortho positions and $Y_3$ is at the para position and are each selected from the group of hydrogen and an organic group.

Preferably, the organics are activating groups such as phenyls and alkyls ($C_6H_5$, $CH_3$, $C_2H_5$ etc.) or heteroatoms such as the alkoxides, —$OCH_3$, —$OC_2H_5$ etc; —$NHCOCH_3$; —OH; and $NH_2$ (NHR, NR) where R is a radical. The hetroatom may be used where the potential for O or N incorporation into the deposited films is not a problem.

Preferably, in order to increase steric hinderance between the sterically hindered cadmium organic and the tellurium organic, the tellurium organic is selected to include large bulky organic groups which will likewise sterically hinder the tellurium organic molecule from reacting with the cadmium organic. As described in copending U.S. patent application Ser. No. 844,489 filed Mar. 26, 1986 by William Hoke et al and assigned to the assignee of the present invention, a tellurium source having a relatively low activation energy for formation of a free radical during pyrolsis when compared to the activation energy for diethyltelluride is the tertiary alkyl ditertiarybutyltelluride. Ditertiarybutyltelluride has a general chemical structure given below:

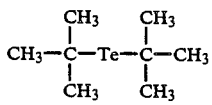

Ditertiarybutyltelluride includes two tertiary butyl groups bonded directly to the tellurium atom. Accordingly, the presence of the tertiary butyl groups in the tellurium organo ditertiarybutyltelluride, destabilize the tellurium organic and sterically hinders the tellurium atom. Selection of ditertiarybutyltelluride as the tellurium organic source and selection of one of the sterically hindered cadmium sources mentioned above will provide increased steric hinderance and, therefore, increase reactive free transport of the cadmium and tellurium organics thru the reactor vessel.

Other sources of tellurium (Group VI element) include diisopropyltelluride (DIPTe) having the general chemical structure given below:

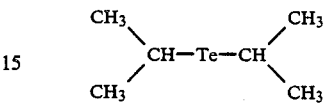

Diisopropyltelluride, as described in the copending application of Hoke et al, Ser. No. 918,697 filed Oct. 16, 1986 which is a continuation of Ser. No. 838,192 filed Mar. 7, 1986, now abandoned, which was a continuation of Ser. No. 749,851 filed June 28, 1985, now abandoned, assigned to the assignee of the present invention, has a lower stability and, hence, enhanced cracking efficiency when compared to the cracking efficiency of DETe. DIPTe is a preferred example of a secondary tellurium alkyl. The bulky isopropyl also sterically hinder the tellurium atom from reacting with the Cd organic.

As also described in U.S. patent application Ser. No. 876,608 filed June 20, 1986 by W. Hoke et al, greater delocatization and consequently lower activation energies are provided using the overlap of the p orbital of the unpaired electron with double bonds instead of single bonds. The allyl radical, the benzyl radical, and cycloallyl radical each delocalize the free electron charge over the entire carbon chain. Preferred examples of allyls, benzyls, and cycloallyls of the Group VI element are shown in the Table.

Therefore, tellurium organic sources such as ditertiarybutylelluride or the aforementioned secondary alkyls, allyls, cycloallyls, or benzyls, each provide lower activation energy for formation of a free radical and, consequently, reduced growth temperatures. By selecting the tellurium organic in junction with the selection of the cadmium organic compound, growth of Group II-VI materials such as mercury cadmium telluride will occur at lower growth temperatures, the selected organics will sterically hinder each other, and the exchange reaction between the Group II organic source and mercury will be kinetically limited.

As described in conjunction with U.S. patent application Ser. No. 844,489 filed Mar. 26, 1986, growth of Group II-VI semiconductor materials using ditertiarybutyltelluride as the tellurium organic can occur at temperatures as low as about 230° C. It is believed that at this temperature, the exchange reaction (Reaction 7) between mercury and the cadmium organic, as previously mentioned, will be substantially kinetically limited. Thus, the exchange reaction will not be a significant source of cadmium depletion as in prior techniques.

TABLE

| Formula | Representation | Name |
|---|---|---|
| $(C_6H_5CH_2)_2Te$ | $C_6H_5$—$CH_2$—Te—$CH_2$—$C_6H_5$ | dibenzyltelluride |
| $CH_3(C_6H_5CH_2)Te$ | $CH_3$—Te—$CH_2$—$C_6H_5$ | methyl-benzyltelluride |

TABLE-continued

| Formula | Representation | Name |
|---|---|---|
| (CH₂CHCH₂)₂Te | CH₂=CH—CH₂—Te—CH₂—CH=CH₂ | di(2-propen-1-yl)telluride |
| CH₃(CH₂CHCH₂)Te | CH₃—Te—CH₂—CH=CH₂ | methyl-(2-propen-1-yl)telluride |
| (C₃H₃)₂Te | (see structure) | di(2-cyclopropen-1-yl)telluride |
| CH₃(C₃H₃)Te | (see structure) | methyl-(2-cyclopropen-1-yl)telluride |

Accordingly, with the above described arrangement substantially reactive free transport of the cadmium organic and the tellurium organic will be provided, and the cadmium organic and the tellurium organic will undergo substantially independent pyrolysis over the elevated temperature region of the substrate, thereby, providing mercury cadmium telluride films having improved front to back compositional uniformity. It is also believed that the side to side compositional uniformity of the deposited mercury cadmium telluride films will also be improved.

To further reduce the attraction between the electropositive Cd atom (Group II atom) and electronegative Te atom (Group VI atom), electron withdrawal from the Te( Group VI) atom may be accomplished by selecting the Te (Group VI) organic source to have electron withdrawal groups, as shown below for Te:

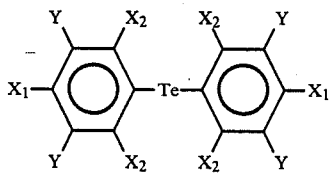

where $X_1$ and $X_2$ are generally hydrogen and Y is a meta position deactivating group selected from the group —NO₂; —N(CH₃)₃+; —CN; —COOH (—COOR); SO₃H —CHO (-CRO) where R is an organic group, keeping in mind the potential for N, O, S etc. incorporation into the Group II-VI layers.

Alternatively, the para, ortho position hydrogens ($X_1$, $X_2$ positions) may be replaced by a halogen (—F, —Cl, —Br, —I) and the meta positions groups are hydrogen.

Having described preferred embodiments of the invention, it will now be apparent to one of skill in the art that other embodiments incorporating their concepts may be used. It is felt, therefore, that these embodiments should not be limited to the disclosed embodiments, but rather should be limited only by the spirit and scope of the appended claims.

What is claimed is:

1. A method of providing a layer comprising a Group II-VI semiconductor material over a substrate, comprises the step of:
    directing a flow comprising a Group II metalorganic and a Group VI organic towards the substrate with both of said Group II and Group VI organics each having at least one large bulky organic group which sterically repulses the large bulky organic group of the other one of the Group II and Group VI organics;
    depositing from said directed flow said Group II-VI semiconductor material over the substrate.

2. The method as recited in claim 1 wherein the selected large bulky organic groups are branched organic groups.

3. The method as recited in claim 2 wherein the selected large bulky branched organic group for the Group II organic is selected from the group consisting of secondary and tertiary alkyls, bonded to a beta position carbon atom in the chain of the Group II organic, and a phenyl bonded directly to the Group II atom; and
    wherein the selected group for the Group VI atom is bonded directly to the Group VI atom, and is selected from the group consisting of secondary alkyls, tertiary alkyls, allyls, benzyls, and cycloallyls.

4. A method of providing a layer comprising a Group II-VI material comprises the steps of:
    directing a flow comprising a Group VI organic towards a substrate;
    directing a flow comprising a Group II organic towards the substrate, with said Group II organic having large bulky organic groups selected to sterically repulse the Group VI organic; and
    reacting said Group VI and Group II organics to form the Group II-VI material over the substrate.

5. The method as recited in claim 4 wherein the Group II organic has an organic group which incorporates a beta position carbon atom in the Group II organic.

6. The method as recited in claim 5 wherein the organic group which incorporates the beta position carbon atom is selected from the group consisting of isopropyl and tertiary butyl.

7. The method as recited in claim 6 wherein the reacting step occurs substantially in a region over the substrate disposed at an elevated temperature.

8. The method as recited in claim 7 wherein the Group VI organic has at least one organic group selected from the group consisting of a secondary alkyl, a tertiary alkyl, an allyl, a benzyl, and a cycloallyl.

9. The method as recited in claim 8 wherein the selected organic is bonded directly to the Group VI element.

10. The method as recited in claim 4 wherein the Group II organic has the general chemical structure as set forth below:

$$R_1-A-R_2$$

where A is the selected Group II atom, and where $R_1$, $R_2$ may or may not be the same and where at least one of $R_1$, $R_2$ has the general chemical structure as set forth below:

$$Y-\underset{X_2}{\overset{X_1}{\underset{|}{\overset{|}{C}}}}-$$

where $X_1$, $X_2$ may or may not be the same and are selected from the group consisting of hydrogen, a halogen, and an organic; and where Y has the general chemical structure set forth below:

$$Y_2-\underset{Y_3}{\overset{Y_1}{\underset{|}{\overset{|}{C}}}}-$$

where $Y_1$, $Y_2$, and $Y_3$ may or may not be the same and each is selected from the group consisting of hydrogen, a halogen, and an organic.

11. The method as recited in claim 10 wherein $Y_1$, $Y_2$, and $Y_3$ are alkyl organic groups.

12. The method as recited in claim 10 wherein the Group VI organic has at least one organic group selected from the group consisting of a secondary alkyl, a tertiary alkyl, an allyl, a benzyl, and a cycloallyl.

13. The method as recited in claim 11 wherein the selected organic is bonded directly to the Group VI element.

14. The method as recited in claim 4 further comprising the step of:
directing a flow of a elemental source of a Group II element towards the substrate; and wherein the reacting step includes reacting said Group II element with the Group II organic and Group VI organic to provide the layer.

15. The method as recited in claim 14 wherein the reaction step to provide the Group II-VI material occurs at a temperature at which an exchange reaction involving the Group II metal and Group II organic is substantially kinetically limited.

16. The method as recited in claim 15 wherein the reaction step occurs at a temperature of less than 320° C.

17. The method as recited in claim 16 wherein the Group II organic has at least one organic group which incorporates a beta position carbon atom in said Group II organic; and
wherein the Group VI organic has at least one group selected from the group consisting of a secondary alkyl, a tertiary alkyl, an allyl, a cycloallyl, and a benzyl.

18. The method as recited in claim 15 wherein the reaction step occurs at a temperature of less than 280° C.

19. The method as recited in claim 18 wherein the Group II organic has at least one organic group which incorporates a beta position carbon atom in said organic group; and
the Group VI organic has at least one group selected from the group consisting of a tertiary alkyl, an allyl, a cycloallyl, and a benzyl.

20. A method of providing a layer comprising mercury cadmium telluride over a substrate, comprises the steps of:
directing a flow of a source of mercury towards the substrate;
directing a flow of a source of tellurium towards the substrate; and
directing a flow comprising a cadmium organic towards the substrate, with said organic having the general chemical formula:

$$R_1-Cd-R_2$$

where $R_1$, $R_2$ may or may not be the same at least one of $R_1$, $R_2$ has the general chemical formula:

$$Y_1-\underset{Y_3}{\overset{Y_2}{\underset{|}{\overset{|}{C}}}}-\underset{X_2}{\overset{X_1}{\underset{|}{\overset{|}{C}}}}-$$

where $X_1$, $X_2$ may or may not be the same and are selected from the group consisting of hydrogen, an organic group, and a halogen; and
where $Y_1 Y_2$, $Y_3$ may or may not be the same and at least two of $Y_1$, $Y_2$, $Y_3$ are organic groups.

21. The method as recited in claim 20 wherein the source of mercury is elemental source of mercury and the source of tellurium is an organic tellurium having at least one organic group selected from the group consisting of a primary alkyl, a secondary alkyl, a tertiary alkyl, an allyl, a benzyl, and a cycloallyl group bonded directly to the tellurium atom.

22. The method as recited in claim 21 wherein the tellurium organic is selected from the group consisting of diethyltelluride, di-isopropyltelluride, ditertiarybutyltelluride, dibenzyltelluride, di-(2-propen-1-yl)telluride, di-(2-cyclopropen-1-yl)telluride, X-ethyltelluride, X-isopropyltelluride, X-tertiarybutyltelluride, X-benzyltelluride, X-(2-propen-1-yl)telluride, and X-(2-cyclopropen-1-yl)telluride:
where X is selected from the group consisting of a halogen, hydrogen, and an organic group.

23. A method for growing a layer comprising Group II-VI material over a substrate comprises the steps of:
directing a first flow comprising a selected Group VI organic towards the substrate;
directing a Group II organic towards the substrate, with said Group II organic having at least one phenyl group bonded directly to the Group II atom depositing from said directed flow said Group II-VI material over the substrate.

24. The method as recited in claim 23 wherein the phenyl group is an electron releasing organic group and provides electron transfer to the electropositive Group II atom.

25. The method as recited in claim 24 wherein the electron releasing phenyl further comprises at least one group substituted for a hydrogen atom at a first one of the para and one of the pair of ortho positions of the phenyl group.

26. The method as recited in claim 25 wherein the substituting group is an electrophilic activating group.

27. The method as recited in claim 26 wherein the substituting group is selected from the group consisting of a phenyl and alkyl, an alkoxide, —$NH_2$, —NHR, —NRR, —OH and —$NHCOCH_3$ where R is a radical.

28. The method as recited in claim 27 wherein the substituting group is selected from a phenyl and an alkyl.

29. The method as recited in claim 25 wherein the selected organic group substituted for the hydrogen at the first one of the para and one of the ortho positions of the phenyl group sterically repulses the selected tellurium organic as the tellurium organic and the selected cadmium organic are directed toward the substrate in the vapor stream.

30. The method as recited in claim 29 wherein the substituted organic group is a methyl group and is bonded to one of the ortho positions of the phenyl group.

31. The method as recited in claim 29 wherein the phenyl group has each ortho position hydrogen atoms substituted with a methyl group.

32. The method as recited in claim 29 wherein the phenyl groups have both ortho position and para position hydrogen atoms substituted by methyl groups.

33. A method of growing a layer comprising mercury cadmium telluride over a substrate comprises the steps of:
  directing a first flow comprising a Group VI organic towards the substrate;
  directing a flow comprising a source of mercury towards the substrate;
  directing a flow comprising a cadmium organic towards the substrate, said cadmium organic selected from the group consisting of diphenylcadmium, di-orthotolylcadmium, di-(2,6 Xylyl)cadmium, and di-mesitylcadmium; and
  depositing from the directed flows the mercury cadmium telluride over the substrate.

34. The method as recited in claim 33 wherein the selected tellurium organic has at least one organic group selected from the group consisting of a primary alkyl, a secondary alkyl, a tertiary alkyl, an allyl, a benzyl, and a cycloallyl group bonded to the Group VI element.

35. A method of growing a Group II-VI layer comprising the steps of:
  directing a flow comprising a Group II organic;
  directing a flow comprising a Groups VI organic having at least one phenyl group which withdraws electrons from the Group VI element depositing from said directed flow said Group II-VI material over the substrate.

36. The method as recited in claim 35 wherein the phenyl group is bonded directly to the Group VI element and has deactivating meta directors selected from the group of —$NO_2$; —$N(CH_3)_3{}^+$; —CN; —COOH; —$SO_3H$; —CHO; —COOR; and —COR where R is selected from the group consisting of any suitable group and element.

37. The method as recited in claim 36 wherein the organic is a phenyl group bonded directly to the Group VI element having deactivating para, and ortho directors substituting for hydrogen at the para and ortho positions and consist of the halogens.

38. A method of growing a layer comprising cadmium telluride over a substrate comprises the steps of:
  directing a first flow comprising ditertiarybutyltelluride towards the substrate;
  directing a second flow comprising di-neo-pentylcadmium towards the substrate; and
  depositing cadmium telluride from the first and second flows onto the substrate.

39. The method as recited in claim 38 wherein the depositing step occurs substantially over the substrate, which is heated to a temperature sufficient to cause the directed ditertiarybutyltelluride and di-neopentylcadmium to pyrolyze, to provide the cadmium telluride.

40. A method of providing a layer comprising mercury cadmium telluride ($Hg_{(1-x)}Cd_xTe$) over a substrate where x is the compositional ratio of Cd to Te and where x is substantially uniform throughout the layer of mercury cadmium telluride comprises the steps of:
  providing the substrate in a region which is disposed at an elevated temperature;
  directing a flow comprising a tellurium organic towards the substrate;
  directing a flow comprising mercury towards the substrate;
  directing a flow comprising a cadmium organic towards the substrate, with said cadmium organic having large bulky organic groups selected to sterically repulse the tellurium organic more than diethylcadmium; and
  depositing from said tellurium and cadmium organics and mercury the $Hg_{(1-x)}Cd_xTe$ layer over the substrate.

41. The method as recited in claim 40 wherein the cadmium organic includes at least one organic group which incorporates a beta position carbon atom in the cadmium organic.

42. The method as recited in claim 41 wherein the organic group which incorporates the beta position carbon atom is selected from the group consisting of isopropyl and tertiarybutyl.

43. The method as recited in claim 41 wherein the organic group which incorporates the beta position carbon atom is tertiarybutyl.

44. The method as recited in claim 43 wherein the tellurium organic has at least one organic group selected from the group consisting of a secondary alkyl, a tertiary alkyl, an allyl, a benzyl, and a cycloallyl bonded directly to the tellurium atom.

45. The method as recited in claim 44 wherein the cadmium organic is di-neopentylcadmium and the tellurium organic is ditertiarybutyltelluride.

46. The method as recited in claim 40 wherein the cadmium organic has the general chemical structure as set forth below:

where Cd is the cadmium atom, and where $R_1$, $R_2$ may or may not be the same and where at least one of $R_1$, $R_2$ has the general chemical structure as set forth below:

where $X_1$, $X_2$ may or may not be the same and are preferably selected for the group consisting of hydrogen, a halogen, and an organic; and where Y has the general chemical structure set forth below:

where $Y_1$, $Y_2$, and $Y_3$ may or may not be the same and each is an organic group.

47. The method as recited in claim 46 wherein $Y_1$, $Y_2$, and $Y_3$ are alkyl organic groups.

48. The method as recited in claim 46 wherein the tellurium atom has at least one organic group selected from the group consisting of a secondary alkyl, a tertiary alkyl, an allyl, a benzyl, and a cycloallyl bonded directly to the tellurium atom.

49. The method as recited in claim 48 wherein the Cd organic is di-neopentylcadmium and the Te organic is ditertiarybutyltelluride.

50. The method as recited in claim 40 wherein the step of directing mercury comprising the step of:
    directing a flow of elemental mercury towards the substrate.

51. The method as recited in claim 50 wherein the depositing step to provide the $Hg_{(1-x)}Cd_xTe$ occurs at a temperature at which an exchange reaction involving mercury and the cadmium organic is substantially kinetically limited.

52. The method as recited in claim 51 wherein the reaction step occurs at a temperature of less than 320° C.

53. The method as recited in claim 52 wherein the cadmium organic has at least one organic group which incorporates a beta position carbon atom in said organic group; and
    wherein the tellurium organic has at least one group selected from the group consisting of a secondary alkyl, a tertiary alkyl, an allyl, a cycloallyl, and a benzyl.

54. The method as recited in claim 51 wherein the reaction step occurs at a temperature of less than 280° C.

55. The method as recited in claim 51 wherein the cadmium organic has at least one organic group which incorporates a beta position carbon atom in said organic; and
    the Group VI organic has at least one group selected from the group consisting of a tertiary alkyl, an allyl, a cycloallyl, and a benzyl.

56. The method as recited in claim 40 wherein the cadmium organic has the general chemical structure:

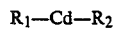

where $R_1$ is bonded to the Cd atom and has the structure:

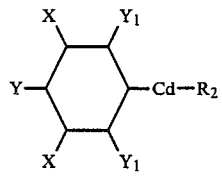

where X is hydrogen and $Y_1$, $Y_2$ and $Y_3$ are selected for the group consisting of hydrogen, an organic, a halogen, and where $R_2$ is selected from the group consisting of $R_1$ and another organic group.

57. The method of claim 56 wherein the tellurium organic has at least one organic group selected from the group consisting of a secondary alkyl, a tertiary alkyl, an allyl, a benzyl, and a cycloallyl group bonded directly to the tellurium atom.

58. The method as recited in claim 57 wherein the cadmium organic is selected from the group consisting of di-phenylcadmium, di-orthotolylcadmium, di-(2,6-Xylyl)cadmium, and di-mesitylcadmium.

59. The method as recited in claim 57 wherein the cadmium organic is selected from the group consisting of di-phenylcadmium and di-orthotolylcadmium.

* * * * *